United States Patent
Koh

(10) Patent No.: US 7,042,062 B2
(45) Date of Patent: May 9, 2006

(54) DEVICE ISOLATION STRUCTURES OF SEMICONDUCTOR DEVICES AND MANUFACTURING METHODS THEREOF

(75) Inventor: Kwan-Ju Koh, Bucheon (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 11/027,034

(22) Filed: Dec. 30, 2004

(65) Prior Publication Data

US 2005/0145980 A1 Jul. 7, 2005

(30) Foreign Application Priority Data

Dec. 31, 2003 (KR) ........................ 10-2003-0101893

(51) Int. Cl.
*H01L 21/762* (2006.01)

(52) U.S. Cl. ...................................... 257/506; 438/424

(58) Field of Classification Search ................ 438/437, 438/FOR. 227; 257/506
See application file for complete search history.

(56) References Cited

U.S. PATENT DOCUMENTS

| 5,620,930 | A | * | 4/1997 | Hey et al. .................... 438/421 |
| 5,696,019 | A | * | 12/1997 | Chang ......................... 438/221 |
| 5,834,360 | A | * | 11/1998 | Tesauro et al. ............. 438/445 |
| 6,046,483 | A | * | 4/2000 | Tesauro et al. ............. 257/396 |
| 6,232,649 | B1 | * | 5/2001 | Lee ............................ 257/588 |
| 6,291,298 | B1 | * | 9/2001 | Williams et al. ............ 438/270 |
| 6,403,486 | B1 | * | 6/2002 | Lou ........................... 438/694 |
| 6,451,654 | B1 | * | 9/2002 | Lin et al. .................... 438/266 |

* cited by examiner

*Primary Examiner*—George Fourson
(74) *Attorney, Agent, or Firm*—Andrew D. Fortney

(57) ABSTRACT

A device isolation structure of a semiconductor device may be a silicon wafer, a trench formed in the silicon wafer to have a predetermined depth, a first thermal oxide layer formed to an inner surface of the trench, a pad oxide layer formed on the silicon wafer, a second thermal oxide layer formed on the pad oxide layer and having a round side adjacent to an opening of the trench, and a field oxide layer filled in the trench having the first thermal oxide layer.

10 Claims, 3 Drawing Sheets

DEVICE ISOLATION STRUCTURES OF SEMICONDUCTOR DEVICES AND MANUFACTURING METHODS THEREOF

TECHNICAL FIELD

The present invention relates to semiconductor devices and, more particularly, to device isolation structures of semiconductor devices and manufacturing methods thereof.

BACKGROUND

In general, the local oxidation of silicon (LOCOS) process is one of the popularly used methods to obtain a device isolation structure by selective oxidation. In a typical LOCOS process, a pad oxidation layer is first grown on a silicon wafer where device elements will be formed, and a pad nitride layer made of an oxidation-preventing mask material is deposited thereon. Then, irradiation and etching are performed using a mask to set a region for forming a device isolation layer. Next, wet etching and dry etching oxidations are performed at a high temperature, so that a thick oxide layer is grown. The grown oxide layer is used as a device isolation layer in the LOCOS process.

However, the LOCOS process can bring about the defective crystallization of silicon wafers due to a "bird's beak" phenomenon by side oxidation and a stress of the pad nitride layer by thermal treatment. This can affect an electric characteristic of the semiconductor device as dimensions of semiconductor devices are more highly integrated.

For this reason, shallow trench isolation (STI) is gradually replacing the conventional LOCOS process for the formation of a device isolation structure.

In an STI process, a trench having a predetermined depth is formed in a silicon wafer. An oxide layer is deposited on the trench and then chemical mechanical polishing (CMP) is performed to polish-etch a redundant portion of the oxide layer, resulting in the formation of a device isolation structure.

However, in the STI process, when the redundant portion of the oxide layer, which fills the trench is polish-etched by the CMP process, the partial edges of the device isolation layer are over-etched, thereby generating a moat. The moat generated at the edge of the device isolation layer causes an electric fringing field when the semiconductor device is operated, thereby generating electrical degradation. Also, a threshold voltage is generated due to a hump, and thus to control a leakage current is difficult. Finally, the semiconductor device becomes unstable in its characteristics and operation.

DETAILED DESCRIPTION

Figure 1:
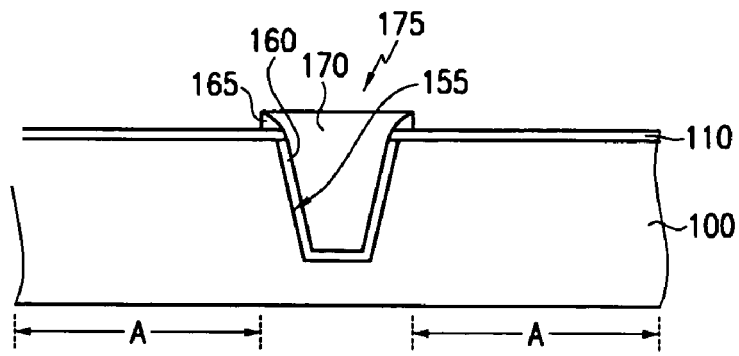
FIG. 1 is a schematic cross-sectional view of an isolation layer of a semiconductor device as disclosed herein.

In the drawings, the thickness of the layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

Referring to FIG. 1, a device isolation structure 175 is formed in a silicon wafer 100 to define active regions A. The device isolation structure 175 includes a first thermal oxide layer 60 formed to an inner surface of a trench 155 having a predetermined depth in the silicon wafer 100, a pad oxide layer 110 formed on the silicon wafer 100 excepting an opening of the trench 155, a second thermal oxide layer 165 formed on the pad oxide layer 110, having a round side adjacent to an opening of the trench 155, and a field oxide layer 170 filled in the trench 155.

In this isolation structure, the trench opening is rounded by the second thermal oxide layer 165 in order to obtain a wider opening. The wider opening enables filling of a field oxide in the trench to be performed with ease, even when the trench width is narrowed as dimensions of semiconductor devices become more highly integrated. Further, the upper edge of the trench 155 is covered with the pad oxide layers 110 and the second thermal oxide layer 2, thereby preventing a moat from being generated at the upper edge of the trench 155.

Manufacturing methods for forming the above-mentioned semiconductor device will be now described with reference to the accompanying drawings.

Figure 2A:
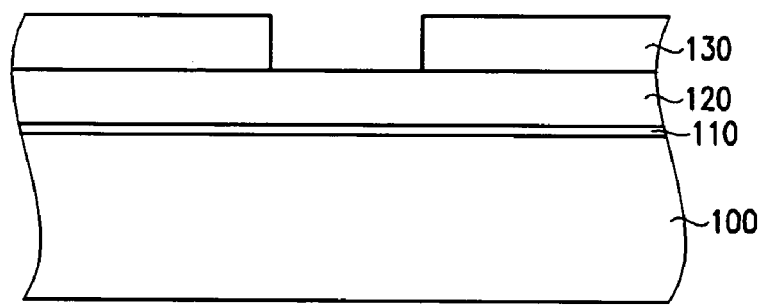
FIGS. 2A through 2G are schematic cross-sectional views showing a semiconductor device after processing as disclosed herein to manufacture an isolation layer of a semiconductor device.

As shown in FIG. 2A, a pad oxide layer 110 and a pad nitride layer 120 are successively deposited on a silicon wafer 100. Here, the pad oxide layer 110 reduces stress of the silicon wafer 100 and the pad nitride layer 120, and stops the progress of etching in a subsequent process for removing the pad nitride layer 120. Also, the pad nitride layer 120 functions as a mask in a subsequent trench etching process. According to one example, the pad oxide layer 110 has a thickness of 100 Å to 200 Å, and the pad nitride layer 120 has a thickness of 1000 Å to 3000 Å.

Next, a photoresist layer (not shown) is deposited on the pad nitride layer 120. Then, irradiation and developing processes are performed successively, resulting in the formation of a first photoresist pattern 130, which defines the active regions A of the silicon wafer 100.

Figure 2B:
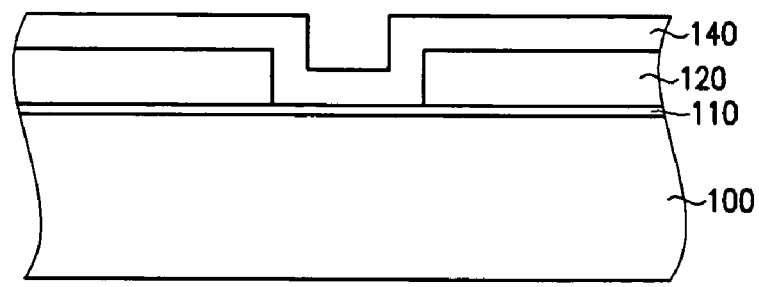

As shown in FIG. 2B, the pad nitride layer 120 is then etched selectively using a mask of the first photoresist pattern 130 to expose the partial pad oxide layer 110 in the device isolation region. A poly-silicon layer 140 is then formed on the silicon wafer 100 underlying the pad nitride layer 120. In one example, the poly-silicon layer 140 has a thickness of 300 Å to 1500 Å.

Figure 2C:
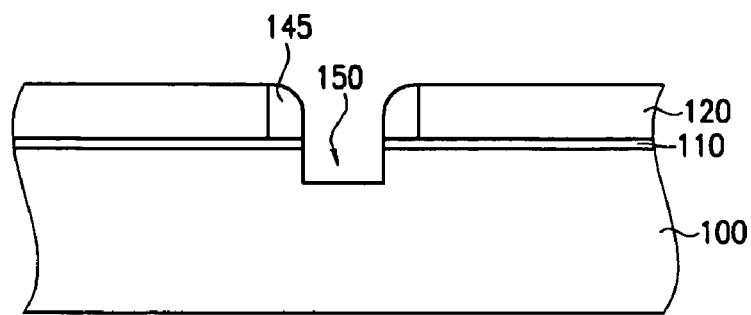

As shown in FIG. 2C, after the first photoresist pattern 130 is removed, the poly-silicon layer 140 is back-etched to form a poly stringer 145 to a sidewall of the back-etched poly-silicon layer 140. The partial silicon wafer 100 is also back-etched to form a first trench 150 in the silicon wafer 100. In one example, the etchback process finishes when the depth of the first trench 150 reaches 20% to 40% of a final trench depth. That is, with the etchback process it is possible to form the poly stringer 145 at the sidewall of the pad nitride layer 120 and to adjust the depth of the first trench 150 at the same time, because the process is performed on the basis of a selection ratio of nitride and silicon.

Figure 2D:
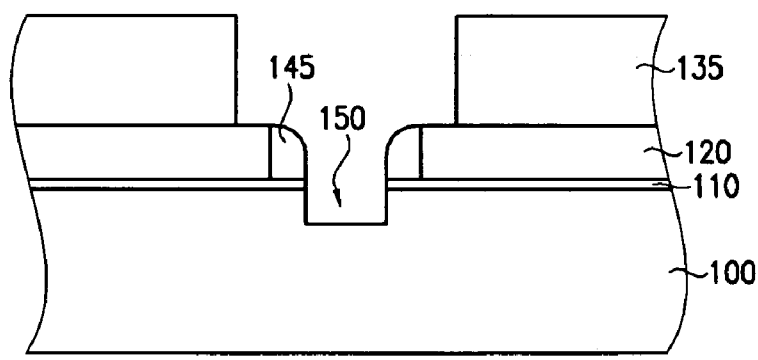

Next, as shown in FIG. 2D, a photoresist layer (not shown) is deposited on the pad nitride layer 120 and then irradiation and developing processes are performed successively, so that a second photoresist layers pattern 135 that is thicker than the first photoresist pattern 130 (shown in FIG. 2A) is formed.

Figure 2E:
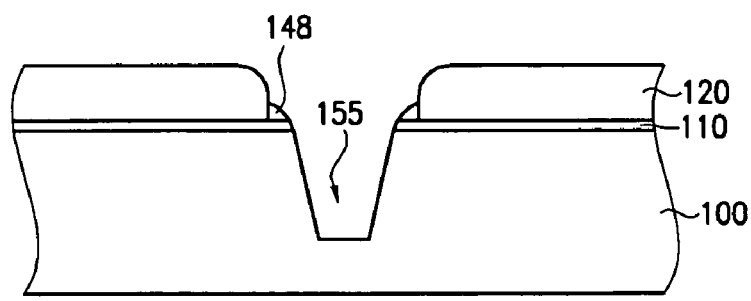

Subsequently, as shown in FIG. 2E, the silicon wafer 100 is etched selectively using a mask of the second photoresist pattern 135 and the pad nitride layer 120 to form a second trench 155. At that time, the partial portion of the poly stringer 148 remains on the sidewall of the pad nitride layers 120. In other words, the silicon wafer 100 is etched until the poly stringer 148 remains partially on the sidewall of the pad nitride layer 120, thereby forming the second trench 155. According to one particular example, the second trench 155 has a depth of 4000 Å to 10,000 Å. In other words, in the etching process to form the second trench 155, the pad nitride layer 120 and the poly stringer 145 which are adjacent to the opening of the second trench 155 are partially etched at the same time, so that the etched sidewall of the pad nitride layer 120 and the partial portion of the remaining poly stringer 148 are rounded. Accordingly, the opening of the second trench 155 broadens, and thus filling can be performed easily in a subsequent step for filling the field oxide in the second trench 155.

Figure 2F:
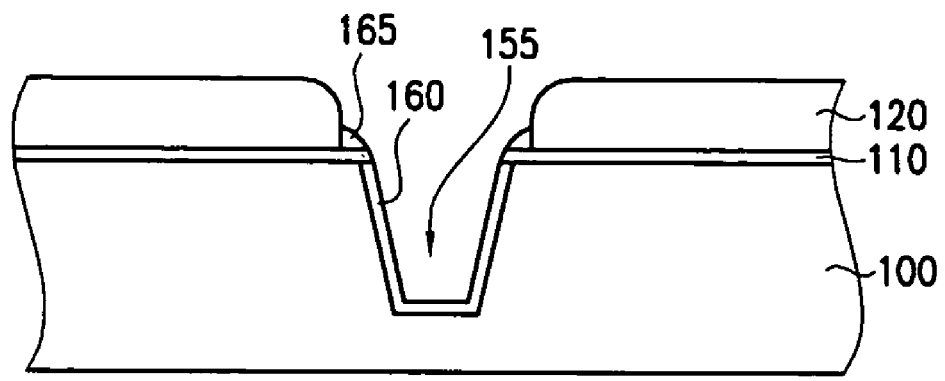

Next, as shown in FIG. 2F, an oxidation process is performed on the silicon wafer 100 including the remaining poly stringers 148 and the second trench 155. During this process, the partial silicon wafer 100 exposed from the inner surface of the second trench 155 and oxygen react with each other, so that a first thermal oxide layer 160 is formed on the inner surface of the second trench 155. Also, the remaining poly stringer 148 and oxygen react each other, so that a second thermal layer 165 is formed.

Figure 2G:
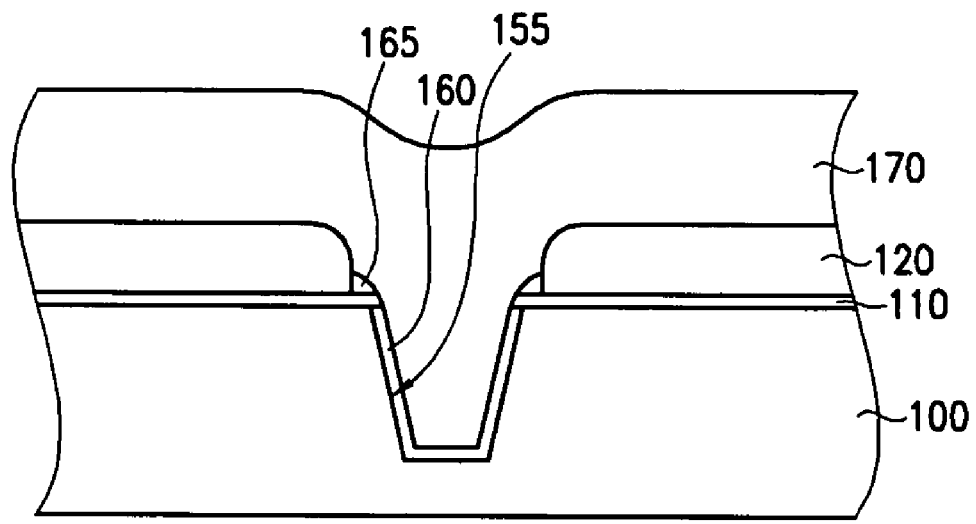

Next, as shown in FIG. 2G, the second trench is substantially completely filled with a field oxide layer 170. Here, the field oxide layer 170 is formed using an oxide layer of HLD or TEOS, etc.

Next, a chemical mechanical polishing (CMP) process is performed on the resultant having the deposited field oxide layer 170 to expose the surface of the pad nitride layer 120, which functions as an etching stopping layer and to polish the resultant, using at least one of the self-stop slurry (SSS) and high selectivity slurry (HSS). Then, the pad nitride layer 120 is removed by a wet etching process using a phosphoric solution, resulting in the formation of a device isolation structure shown in FIG. 1.

The disclosed device isolation structures prevent a defective filling of a void, etc. in the trench filling process because the sidewalls of the trench opening are rounded, even if the trench widths are narrowed as dimensions of the semiconductor devices become more highly integrated. In addition, it prevents a moat from being generated from the partial isolation structure when the redundant portion of the oxide layer which fills the trench are removed, thus giving stability in device characteristics and operation.

As disclosed above, a device isolation structure for use in a semiconductor device isolates adjacent devices from each other for safety. A manufacturing method is also disclosed.

One example device isolation structure may include a silicon wafer; a trench formed in the silicon wafer to a predetermined depth; a first thermal oxide layer formed on an inner surface of the trench; a pad oxide layer formed on the silicon wafer; a second thermal oxide layer formed on the pad oxide layer, having a round side adjacent to an opening of the trench; and a field oxide layer filled in the trench having the first thermal oxide layer. In such an arrangement, the second thermal oxide layer is adjacent to the opening of the trench.

An example method of manufacturing a device isolation structure includes depositing a pad oxide layer and a pad nitride layer, successively; forming a first photoresist pattern for defining a device isolation region on the pad nitride layer; etching the pad nitride layer selectively using a mask of the first photoresist pattern; forming a poly-silicon layer on the entire silicon wafer including the pad nitride layer; forming a second photoresist pattern on the poly-silicon layer for defining a region wider than the device isolation region defined by the first photoresist pattern; back-etching the poly-silicon layer and the silicon wafer using a mask of the second photoresist pattern and the pad nitride layer to form a first trench and a poly stringer; selectively etching the silicon wafer using a mask of the pad nitride layer to form a second trench and to maintain the poly stringer by as much as a predetermined amount to a sidewall of the pad nitride layer, at the same time; oxidizing the second trench and the remaining poly stringer to form a first thermal oxide layer and a second thermal oxide layer; depositing a field oxide layer heavily on the silicon wafer having the first thermal oxide layer and the second thermal oxide layer to fill the second trench; and polishing the field oxide layer by chemical mechanical polishing (CMP) until a surface of the pad nitride layer is exposed, for the planarization.

In a further example, the back-etching process is performed on the basis of a selective ratio of the pad nitride layer and the poly-silicon layer in the step of forming the first trench and the poly stringer by an etchback process of the poly-silicon layer and the silicon wafer using a mask of the second photoresist pattern and the pad nitride layer. The first trench may have a depth of 20% to 30% of a depth of the second trench, and a second trench may have a depth of 4000 Å to 10000 Å. The poly-silicon layer may have a thickness of 300 Å to 1500 Å.

Removing of the pad nitride layer may also be included after the polishing of the field oxide layer, by chemical mechanical polishing (CMP) until a surface of the pad nitride layer is exposed for the planarization.

This patent application makes reference to, incorporates the same herein, and claims all benefits accruing under 35 U.S.C. §119 from an application for DEVICE ISOLATION STRUCTURE OF SEMICONDUCTOR DEVICE AND MANUFACTURING METHOD THEREOF filed in the Korean Industrial Property Office on Dec. 31, 2003 and there duly assigned Serial No. 10-2003-0101893.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A device isolation structure of a semiconductor device comprising:
   a silicon wafer;
   a trench formed in the silicon wafer to have a predetermined depth;
   a first thermal oxide layer formed to an inner surface of the trench;
   a pad oxide layer formed on the silicon wafer;
   a second thermal oxide layer formed on the pad oxide layer, having a round side adjacent to an opening of the trench; and
   a field oxide layer filled in the trench having the first thermal oxide layer.

2. A device isolation structure of claim 1, wherein the second thermal oxide layer is adjacent to the opening of the trench.

3. A method for manufacturing a device isolation structure of a semiconductor device comprising:
   (A) depositing a pad oxide layer and a pad nitride layer, successively;
   (B) forming a first photoresist pattern for defining a device isolation region on the pad nitride layer;

(C) selectively etching the pad nitride layer using a mask of the photoresist pattern;
(D) forming a poly-silicon layer on the entire silicon wafer including the pad nitride layer;
(E) forming a second photoresist pattern on the poly-silicon layer for defining a region wider than the device isolation region defined by the first photoresist pattern;
(F) back-etching the poly-silicon layer and the silicon wafer using a mask of the second photoresist pattern and the pad nitride layer to form a first trench and a poly stringer;
(G) selectively etching the silicon wafer using a mask of the pad nitride layer to form a second trench and to maintain the poly stringer by as much as a predetermined amount to a sidewall of the pad nitride layer, at the same time;
(H) oxidizing the second trench and the remaining poly stringer to form a first thermal oxide layer and a second thermal oxide layer;
(I) depositing a field oxide layer heavily on the silicon wafer having the first thermal oxide layer and the second thermal oxide layer to fill the second trench; and
(J) polishing the field oxide layer by a chemical mechanical polishing (CMP) until a surface of the pad nitride layer are exposed, for the planarization.

4. The method of claim 3, wherein the back-etching is performed on the basis of a selective ratio of the pad nitride layer and the poly-silicon layer.

5. The method of claim 4, wherein the depth of the first trench is 20% to 30% of the depth of the second trench.

6. The method of claim 4, wherein the second trench has a depth of 4000 Å to 10,000 Å.

7. The method of claim 3, wherein the depth of the first trench is 20% to 30% of the depth of the second trench.

8. The method of claim 3, wherein the second trench has a depth of 4000 Å to 10,000 Å.

9. The method of claim 3, wherein the poly-silicon layer has a thickness of 300 Å to 1500 Å.

10. The method of claim 3, further comprising removing the pad nitride layer after polishing the field oxide layer.

* * * * *